United States Patent
Yasunaka et al.

(10) Patent No.: US 10,958,157 B2
(45) Date of Patent: Mar. 23, 2021

(54) INSPECTION APPARATUS, INSPECTION METHOD, AND INVERTER APPARATUS

(71) Applicant: KABUSHIKI KAISHA TOSHIBA, Tokyo (JP)

(72) Inventors: Shigen Yasunaka, Tokyo (JP); Shinji Takakura, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 5 days.

(21) Appl. No.: 16/112,580

(22) Filed: Aug. 24, 2018

(65) Prior Publication Data
US 2019/0288596 A1   Sep. 19, 2019

(30) Foreign Application Priority Data
Mar. 19, 2018   (JP) ................ JP2018-51223

(51) Int. Cl.
| | |
|---|---|
| *H02P 25/22* | (2006.01) |
| *H02P 23/14* | (2006.01) |
| *H02P 21/14* | (2016.01) |
| *H02M 1/32* | (2007.01) |
| *H02M 7/5387* | (2007.01) |
| *G01R 31/42* | (2006.01) |
| *H02P 27/06* | (2006.01) |

(52) U.S. Cl.
CPC ............ *H02M 1/32* (2013.01); *G01R 31/42* (2013.01); *H02M 7/5387* (2013.01); *H02P 27/06* (2013.01); *H02M 2001/327* (2013.01)

(58) Field of Classification Search
CPC ............ H01L 24/34; H02P 6/24; H02P 6/14
See application file for complete search history.

(56) References Cited

U.S. PATENT DOCUMENTS

| 6,160,414 A | 12/2000 | Matsubara et al. | |
|---|---|---|---|
| 2011/0199800 A1* | 8/2011 | Yahata | H02M 7/003 363/131 |
| 2018/0148086 A1* | 5/2018 | Skellenger | B62D 5/0487 |
| 2018/0154887 A1* | 6/2018 | Murata | H02P 5/00 |
| 2018/0154931 A1* | 6/2018 | Shinkawa | B62D 5/046 |

(Continued)

FOREIGN PATENT DOCUMENTS

| JP | H10-23795 A | 1/1998 |
|---|---|---|
| JP | 2006-50711 A | 2/2006 |

(Continued)

*Primary Examiner* — Eduardo Colon Santana
*Assistant Examiner* — Charles S Laughlin
(74) *Attorney, Agent, or Firm* — Finnegan, Henderson, Farabow, Garrett & Dunner L.L.P.

(57) ABSTRACT

According to an embodiment, an inspection apparatus inspects an inverter circuit including three pairs of arms. The apparatus includes a current controller and a control signal generator. The current controller generates a control output for controlling a current to be output by the inverter circuit. The control output enables the current to approach a target value of the current. The control signal generator generates a first control signal for controlling ON/OFF of a first arm as one of the three pairs of arms based on the control output, a second control signal for fixing a second arm paired with the first arm, in an OFF-state, and a third control signal for fixing at least part of arms other than the first arm and the second arm in an ON-state.

12 Claims, 12 Drawing Sheets

(56) References Cited

U.S. PATENT DOCUMENTS

2019/0028052 A1    1/2019  Yasunaka et al.
2019/0187081 A1    6/2019  Takakura et al.

FOREIGN PATENT DOCUMENTS

| | | |
|---|---|---|
| JP | 2007-28741 A | 2/2007 |
| JP | 2015-146658 A | 8/2015 |
| JP | 2019-22403 A | 2/2019 |
| JP | 2019-110671 A | 7/2019 |

* cited by examiner

| | Arm1 | Arm2 | Arm3 | Arm4 | Arm5 | Arm6 | Current direction | | Arm with diode making large contribution |
|---|---|---|---|---|---|---|---|---|---|
| 1 | Control | OFF | OFF | ON | OFF | OFF | u | ⇒ v | Arm2 |
| 2 | Control | OFF | OFF | OFF | OFF | ON | u | ⇒ w | Arm2 |
| 3 | OFF | ON | Control | OFF | OFF | OFF | v | ⇒ u | Arm4 |
| 4 | OFF | ON | Control | OFF | OFF | ON | v | ⇒ w | Arm4 |
| 5 | OFF | OFF | OFF | ON | Control | OFF | w | ⇒ u | Arm6 |
| 6 | OFF | Control | ON | OFF | Control | OFF | w | ⇒ v | Arm6 |
| 7 | OFF | Control | OFF | Control | OFF | OFF | v | ⇒ u | Arm1 |
| 8 | OFF | Control | OFF | Control | OFF | OFF | w | ⇒ u | Arm1 |
| 9 | ON | OFF | OFF | OFF | ON | OFF | u | ⇒ v | Arm3 |
| 10 | OFF | OFF | OFF | OFF | ON | OFF | w | ⇒ v | Arm3 |
| 11 | ON | OFF | ON | OFF | OFF | Control | u | ⇒ w | Arm5 |
| 12 | OFF | OFF | OFF | OFF | OFF | Control | v | ⇒ w | Arm5 |

FIG. 4

| | Arm1 | Arm2 | Arm3 | Arm4 | Arm5 | Arm6 | Current direction | | Arms with diodes making large contribution |
|---|---|---|---|---|---|---|---|---|---|
| 1 | Control | OFF | OFF | ON | Control | OFF | u,w | ⇒ | v | Arm6, Arm2 |
| 2 | Control | OFF | Control | OFF | OFF | ON | u,v | ⇒ | w | Arm2, Arm4 |
| 3 | OFF | ON | Control | OFF | Control | OFF | v,w | ⇒ | u | Arm4, Arm6 |
| 4 | OFF | Control | ON | OFF | OFF | Control | v | ⇒ | u,w | Arm5, Arm1 |
| 5 | OFF | Control | OFF | Control | ON | OFF | w | ⇒ | u,v | Arm1, Arm3 |
| 6 | ON | OFF | OFF | Control | OFF | Control | u | ⇒ | v,w | Arm3, Arm5 |

F I G. 9

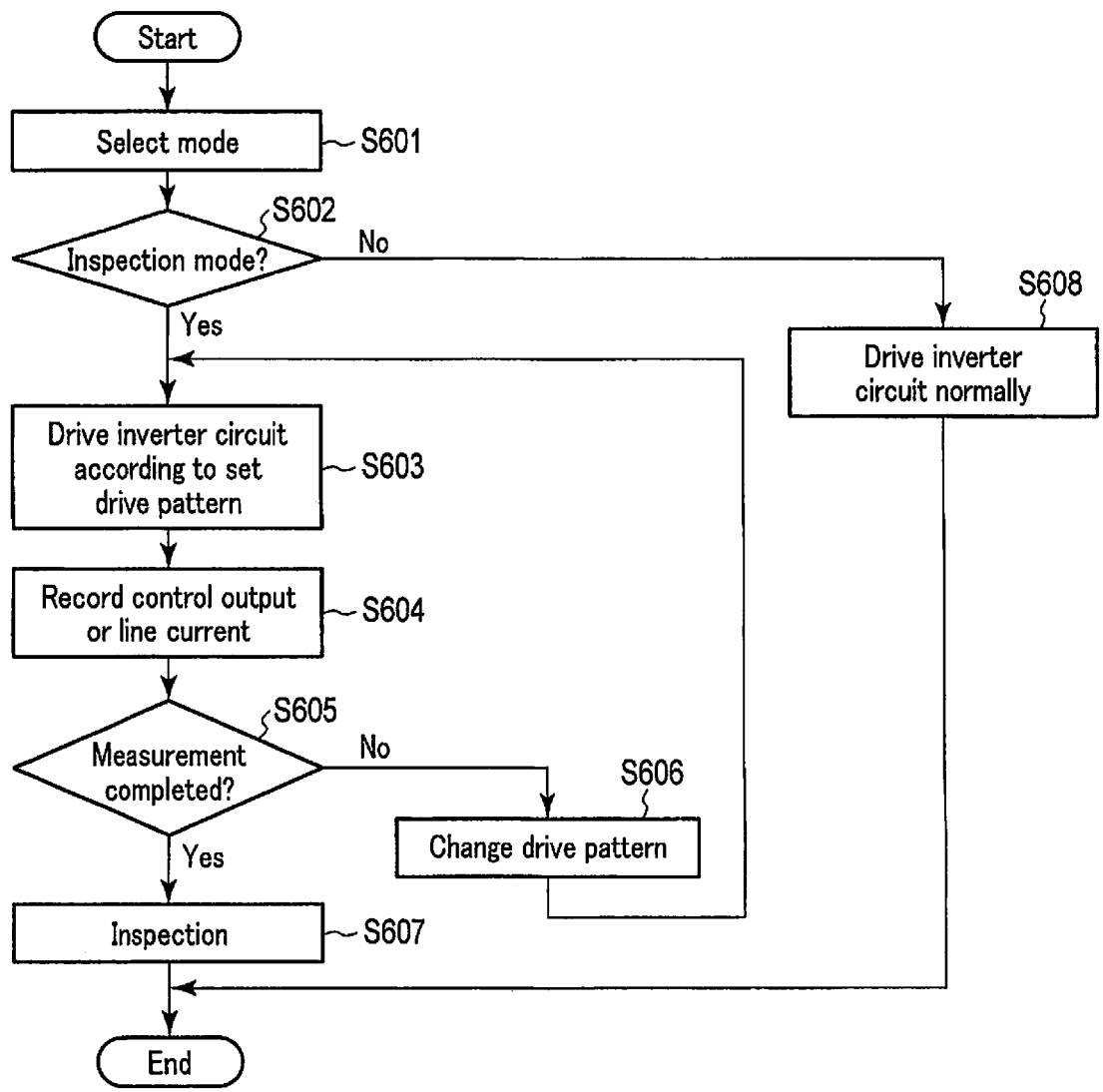
F I G. 13

INSPECTION APPARATUS, INSPECTION METHOD, AND INVERTER APPARATUS

CROSS-REFERENCE TO RELATED APPLICATIONS

This application is based upon and claims the benefit of priority from Japanese Patent Application No. 2018-51223, filed Mar. 19, 2018, the entire contents of which are incorporated herein by reference.

FIELD

Embodiments of the present invention relate to an inspection apparatus, an inspection method, and an inverter apparatus.

BACKGROUND

Inverters are typically used in infrastructures or factories, and a broken inverter causes a large loss. Therefore, it is required that the presence/absence of a failure sign be inspected before an inverter is completely broken. Generally, inverter failure is classified broadly into (1) failure due to a deteriorated electrolytic capacitor, (2) fan failure, (3) relay failure, and (4) failure caused by a deteriorated power device.

The process of causing (4) inverter failure due to a deteriorated power device goes through phenomena such as (a) an increase in threshold value Vth, (b) deterioration in heat radiation due to an embrittled solder part, (c) a decrease in gate voltage due to a deteriorated gate oxide film, and (d) a change in a forward-direction voltage of a diode. All of those phenomena are estimated to cause an increased temperature of a power device. Thus, if abnormal heating (overheating) of a power device is detectable, there is a possibility of catching a sign of inverter failure due to a deteriorated power device.

BRIEF DESCRIPTION OF THE DRAWINGS

FIG. 4 is a table illustrating an example of drive patterns set by the inspection apparatus according to the first embodiment during the inspection mode.

FIG. 7 is a diagram illustrating an equivalent circuit of the inverter circuit and an electric motor when an arm 1 and an arm 5 in FIG. 6 are ON.

FIG. 9 is a table illustrating drive patterns set by the inspection apparatus according to the second embodiment during the inspection mode.

FIG. 13 is a flowchart illustrating operation of the control system in FIG. 1.

DETAILED DESCRIPTION

According to an embodiment, an inspection apparatus inspects an inverter circuit including three pairs of arms. The apparatus includes a current controller and a control signal generator. The current controller generates a control output for controlling a current to be output by the inverter circuit. The control output enables the current to approach a target value of the current. The control signal generator generates a first control signal for controlling ON/OFF of a first arm as one of the three pairs of arms based on the control output, a second control signal for fixing a second arm paired with the first arm, in an OFF-state, and a third control signal for fixing at least part of arms other than the first arm and the second arm in an ON-state.

Hereinafter, embodiments will be described with reference to the drawings. In the description below, structural elements that are identical or similar to those already described will be denoted by the same or similar reference symbols, and repetitive descriptions will be basically omitted.

First Embodiment

Figure 1:
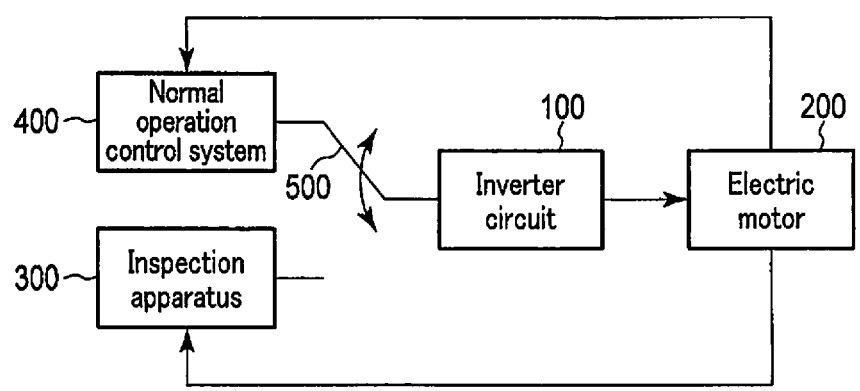
FIG. 1 is a block diagram illustrating a control system of an inverter circuit, including an inspection apparatus according to the first embodiment.

An inspection apparatus according to the first embodiment inspects abnormal heating of arms included in an inverter circuit, in particular, a three-phase inverter circuit. FIG. 1 illustrates a control system of the inverter circuit, including the aforementioned inspection apparatus. The control system in FIG. 1 includes an inverter circuit 100, an electric motor 200, an inspection apparatus 300, a normal operation control system 400, and a switch 500. The inverter circuit 100 and the inspection apparatus 300 may be mounted in the same inverter apparatus or in separate apparatuses.

The inverter circuit 100 is operable in a mode selected from a plurality of modes including a normal mode for a normal operation, that is, for rotatably driving the electric motor 200, and an inspection mode for inspecting abnormal heating of all or part of three pairs of arms included in the inverter circuit 100. A mode may be selected by, for example, a controller (not shown).

The inverter circuit 100 is a three-phase inverter circuit which includes three pairs of power devices (arms) to be described later. Each power device includes a switching element (typically, a transistor) such as a MOSFET (Metal Oxide Semiconductor Field-Effect Transistor), and a diode (a body diode or a circulation diode) connected to the first terminal and the second terminal of the switching element. An ON-resistance (voltage drop) of a switching element shows an increasing tendency with increasing temperature. On the other hand, an ON-resistance of a diode shows a decreasing tendency with increasing temperature. That is, characteristics of a switching element and a diode determine characteristics of a power device in terms of the degree of ease of flowing a current in response to an increase in temperature.

Assume that power devices have characteristics of making it hard for a current to flow when their temperature is increased. With these power devices, deterioration in a given power device causes more current to flow into the other normal power device connected in parallel, so that a temperature difference is less likely to occur between the power devices. That is, abnormal heating of a deteriorated power device is unlikely to stand out. In contrast, assume that power devices have characteristics of making it easy for a current to flow when their temperature is increased. With these power devices, deterioration in a given power device causes a positive feedback in which more current is concentrated on this deteriorated power device as its temperature increases, so that this particular power device may eventually end up in a condition almost like thermal runaway. That is, abnormal heating of a deteriorated power device is likely to stand out. With the latter power devices, there is a possibility that abnormal heating can be inspected with a high degree of accuracy, regardless of the number of parallel power devices.

Typically, the electric motor 200 is a three-phase induction motor which includes three inductors connected in a Y-shape. While the inverter circuit 100 operates in the aforementioned normal mode, the electric motor 200 is rotatably driven by a three-phase AC power output by this inverter circuit 100. In this regard, the electric motor 200 may be replaced with another three-phase load.

In the aforementioned inspection mode, the inverter circuit 100 is connected to the inspection apparatus 300 via the switch 500. The inspection apparatus 300 controls ON/OFF of respective arms included in the inverter circuit 100 in accordance with a given drive pattern. For example, the inspection apparatus 300 measures or calculates a line current of the inverter circuit 100, a control output required for feedback control of this line current, etc., stores a history of line current or control output, and inspects abnormal heating of at least part of arms based on this history. As described later, a drive pattern set for the inspection mode is regulated so that the inverter circuit 100 does not rotate the electric motor 200.

The inspection apparatus 300 may be implemented by using a processor such as an FPGA (Field Programmable Gate Array), a DSP (Digital Signal Processor), a CPU (Central Processing Unit), a microcomputer, etc.

In the aforementioned normal mode, the inverter circuit 100 is connected to the normal operation control system 400 via the switch 500. The normal operation control system 400 controls ON/OFF of respective arms included in the inverter circuit 100 so that the inverter circuit 100 rotatably drives the electric motor 200 by outputting a three-phase AC power having a desired current, voltage, and/or frequency. The normal operation control system 400 may be identical or similar to a control system generally used for a three-phase inverter. The normal operation control system 400 monitors a line current of the inverter circuit 100 and performs feedback control in a manner so that this line current approximates a current command value, for example, 0.3 [A].

The normal operation control system 400 may also be implemented by using a processor, as is the case for the inspection apparatus 300. The inspection apparatus 300 and the normal operation control system 400 are necessarily separated from each other as hardware, but may be formed integrally.

The switch 500 receives a control signal from a controller (not shown), and connects the inverter circuit 100 to the inspection apparatus 300 or the normal operation control system 400 in accordance with the received control signal. Specifically, when the inverter circuit 100 operates in the inspection mode, the switch 500 connects this inverter circuit 100 to the inspection apparatus 300. On the other hand, when the inverter circuit 100 operates in the normal mode, the switch 500 connects this inverter circuit 100 to the normal operation control system 400.

Next, the control system of the inverter circuit 100 in the inspection mode will be described in detail.

Figure 2:
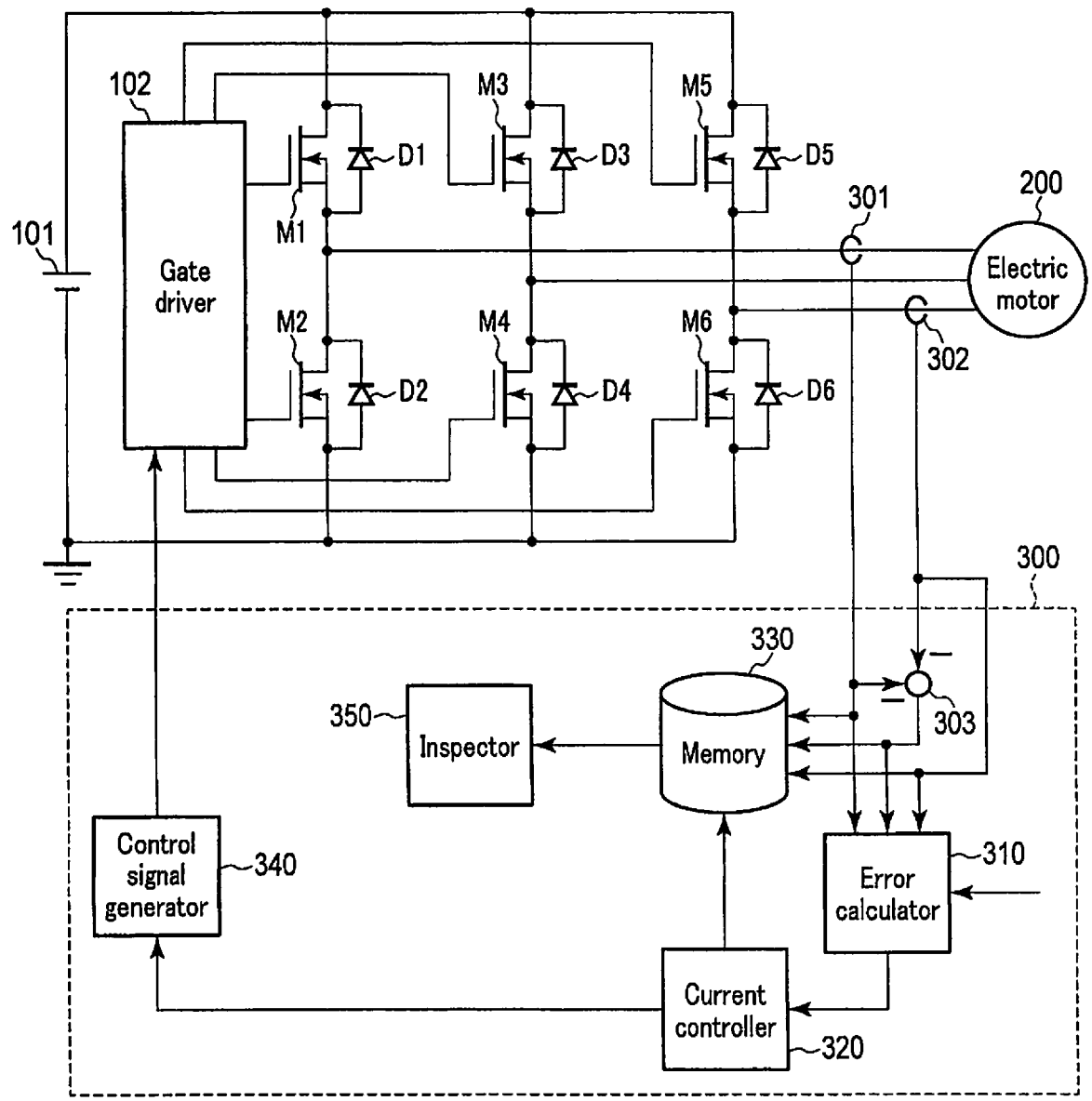
FIG. 2 is a block diagram illustrating the control system of the inverter circuit in FIG. 1 during an inspection mode.

As illustrated in FIG. 2, the inverter circuit 100 includes a power supply 101, a gate driver 102, MOSFETs M1 to M6, and diodes D1 to D6. For convenience in the following description, a pair of the MOSFET M1 and the diode D1, a pair of the MOSFET M2 and the diode D2, a pair of the MOSFET M3 and the diode D3, a pair of the MOSFET M4 and the diode D4, a pair of the MOSFET M5 and the diode D5, and a pair of the MOSFET M6 and the diode D6 are sometimes referred to as arm 1, arm 2, arm 3, arm 4, arm 5, and arm 6, respectively. In the description of the present embodiment, a single arm includes a single pair of a MOSFET and a diode; however, a single arm may include pairs of MOSFETs and diodes which are mutually connected in parallel.

The power supply 101 is typically a DC power source in which a positive electrode is connected to first terminals of the arms 1, 3, and 5, while a negative electrode is grounded and connected to second terminals of the arms 2, 4, and 6. Herein, a voltage of the power supply 101 is, for example, 15 [V], but is not limited thereto.

The gate driver 102 is connected to the inspection apparatus 300 or the normal operation control system 400 via the aforementioned switch 500. The gate driver 102 receives a control signal from the inspection apparatus 300 or the normal operation control system 400, and supplies this signal to control terminals of the arms 1 to 6, that is, gate terminals of the MOSFETs M1 to M6.

The arm 1 includes the first terminal, a second terminal, and the control terminal. The first terminal is connected to the positive electrode of the power supply 101. The second terminal is connected to a first terminal of the arm 2 and an output terminal of u-phase of the inverter circuit 100. The control terminal is connected to the gate driver 102. The arm 1 conducts (ON) or opens (OFF) a part between the first and second terminals depending on whether a voltage of a control signal from the gate driver is high or low. The arm 1 includes the MOSFET M1 and the diode D1.

The MOSFET M1 has a drain terminal, a source terminal, and a gate terminal, which are connected to the first terminal, the second terminal, and the control terminal of the arm 1, respectively. In addition, the diode D1 has a cathode and an anode, which are connected to the first terminal and the second terminal of the arm 1, respectively.

The arm 2 includes the first terminal, the second terminal, and the control terminal. The first terminal is connected to the second terminal of the arm 1 and an output terminal of the u-phase of the inverter circuit 100. The second terminal is connected to the negative electrode of the power supply 101 (that is, grounded). The control terminal is connected to the gate driver 102. The arm 2 conducts or opens a part between the first and second terminals depending on whether a voltage of a control signal from the gate driver is high or low. The arm 2 includes the MOSFET M2 and the diode D2.

The MOSFET M2 has a drain terminal, a source terminal, and a gate terminal, which are connected to the first terminal, the second terminal, and the control terminal of the arm 2, respectively. In addition, the diode D2 has a cathode and an anode, which are connected to the first terminal and the second terminal of the arm 2, respectively.

The arm 3 includes the first terminal, a second terminal, and the control terminal. The first terminal is connected to the positive electrode of the power supply 101. The second terminal is connected to a first terminal of the arm 4 and an output terminal of v-phase of the inverter circuit 100. The control terminal is connected to the gate driver 102. The arm 3 conducts or opens a part between the first and second terminals depending on whether a voltage of a control signal from the gate driver is high or low. The arm 3 includes the MOSFET M3 and the diode D3.

The MOSFET M3 has a drain terminal, a source terminal, and a gate terminal, which are connected to the first terminal, the second terminal, and the control terminal of the arm 3, respectively. In addition, the diode D3 has a cathode and an anode, which are connected to the first terminal and the second terminal of the arm 3, respectively.

The arm 4 includes the first terminal, the second terminal, and the control terminal. The first terminal is connected to the second terminal of the arm 3 and an output terminal of v-phase of the inverter circuit 100. The second terminal is connected to the negative electrode of the power supply 101 (that is, grounded). The control terminal is connected to the gate driver 102. The arm 4 conducts or opens a part between the first and second terminals depending on whether a voltage of a control signal from the gate driver is high or low. The arm 4 includes the MOSFET M4 and the diode D4.

The MOSFET M4 has a drain terminal, a source terminal, and a gate terminal, which are connected to the first terminal, the second terminal, and the control terminal of the arm 4, respectively. In addition, the diode D4 has a cathode and an anode, which are connected to the first terminal and the second terminal of the arm 4, respectively.

The arm 5 includes the first terminal, a second terminal, and the control terminal. The first terminal is connected to the positive electrode of the power supply 101. The second terminal is connected to a first terminal of the arm 6 and an output terminal of the w-phase of the inverter circuit 100. The control terminal is connected to the gate driver 102. The arm 5 conducts or opens a part between the first and second terminals depending on whether a voltage of a control signal from the gate driver is high or low. The arm 5 includes the MOSFET M5 and the diode D5.

The MOSFET M5 has a drain terminal, a source terminal, and a gate terminal, which are connected to the first terminal, the second terminal, and the control terminal of the arm 5, respectively. In addition, the diode D5 has a cathode and an anode, which are connected to the first terminal and the second terminal of the arm 5, respectively.

The arm 6 includes a first terminal, the second terminal, and the control terminal. The first terminal is connected to the second terminal of the arm 5 and an output terminal of the w-phase of the inverter circuit 100. The second terminal is connected to the negative electrode of the power supply 101 (that is, grounded). The control terminal is connected to the gate driver 102. The arm 6 conducts or opens a part between the first and second terminals depending on whether a voltage of a control signal from the gate driver is high or low. The arm 6 includes the MOSFET M6 and the diode D6.

The MOSFET M6 has a drain terminal, a source terminal, and a gate terminal, which are connected to the first terminal, the second terminal, and the control terminal of the arm 6, respectively. In addition, the diode D6 has a cathode and an anode, which are connected to the first terminal and the second terminal of the arm 6, respectively.

The inspection apparatus 300 includes a current sensor 301, a current sensor 302, an adder 303, an error calculator 310, a current controller 320, memory 330, a control signal generator 340, and an inspector 350. The current sensor 301, the current sensor 302, and the adder 303 serve as a line-current measurer/calculator.

The current sensor 301 measures line current iu output from the u-phase, that is, a node between the arms 1 and 2. The current sensor 301 detects, for example, a magnetic field generated by the line current iu, and converts it into an output voltage. If a measurement result by the current sensor 301 takes an analog form, it may be digitized by an A/D converter (not shown).

The current sensor 302 measures line current iw output from the w-phase, that is, a node between the arms 5 and 6. The current sensor 302 detects, for example, a magnetic field generated by the line current iw, and converts it into an output voltage. If a measurement result by the current sensor 302 takes an analog form, it may be digitized by an A/D converter (not shown).

With respect to the line current iu measured by the current sensor 301 and the line current iw measured by the current sensor 302, the adder 303 performs sign inversion and then performs addition. In this manner, the adder 303 calculates the line current iv output from the v-phase, that is, a node between the arms 3 and 4. If a calculation result by the adder 303 takes an analog form, it may be digitized by an A/D converter (not shown).

According to the example in FIG. 2, the line current iv is calculated by the adder 303. However, the line current iv may be measured by the current sensor as is the case for the other line currents. Alternatively, the line current iu or iw may be calculated instead of the line current iv.

The error calculator 310 may receive a value of a three-phase line current from the line current measurer/calculator (which corresponds to the current sensor 301, the current sensor 302, and the adder 303 according to the example in FIG. 2), and receives a current command value from a current command value generator (not shown). The error calculator 310 calculates an error between the line current value and the current command value, and sends this error to the current controller 320.

The current controller 320 receives the error from the error calculator 310, and generates a control output required for feedback control of the line current in a manner so that this error approaches zero (that is, the line current approaches the current command value). The current controller 320 sends the control output to the control signal generator 340.

The memory 330 records a history of three-phase line current (value) measured/calculated by the line current measurer/calculator, and/or a history of control output generated by the current controller 320. As described later, in the present embodiment, the inspector 350 inspects abnormal heating of an arm based on a history of control output. Thus, the memory 330 is not necessarily required to record a history of line current value. On the other hand, in the second embodiment described later, the inspector 350 inspects abnormal heating of an arm based at least on a history of line current. Thus, the memory 330 is required to record a history of line current.

The control signal generator 340 sets any of predetermined drive patterns, generates control signals for the arms 1 to 6 in accordance with this set drive pattern, and sends the control signal to the gate driver 102 via the switch 500. Specifically, the control signal generator 340 controls ON/OFF of the arms 1 to 6 in a manner so that an arm, which is a target for inspection of abnormal heating, increases a contribution of its diode to a control output. In addition, the current command value generator (not shown) changes at least one of a magnitude and a sign of a current command value, in accordance with switching of a set drive pattern.

For example, based on a control output generated by the current controller 320, the control signal generator 340 generates a control signal (also referred to as a first control signal, for convenience) for ON/OFF control of an arm (also referred to as the first arm, for convenience) paired with an arm (also referred to as the second arm, for convenience) as a target for inspection of abnormal heating. Furthermore, the control signal generator 340 generates control signals in a manner to secure a current path including a diode of the second arm when the first arm is OFF. Specifically, the control signal generator 340 generates a control signal (also referred to as the third control signal, for convenience) for fixing one of the two arms connected to a common power supply terminal shared with the second arm in an ON-state, and a control signal (also referred to as the second control signal, for convenience) for fixing the other arm in an OFF-state.

When the control signal generator 340 generates control signals in this manner, the inverter circuit 100 operates like a step-down chopper circuit. Generally, in a step-down chopper circuit, ON/OFF control of arms is performed as follows. In a pair of arms, when one arm (herein, corresponding to the first arm) which repeats ON/OFF is in an OFF-state, the other arm (herein, corresponding to the second arm) is turned ON so as to shorten the time during which a current flows into a diode of the other arm (the second arm). However, the inspection apparatus 300 fixes this second arm in an OFF-state so as to increase a contribution of the diode of the second arm to a control output by prolonging the time during which a current flows into this diode of the second arm.

Figure 3:
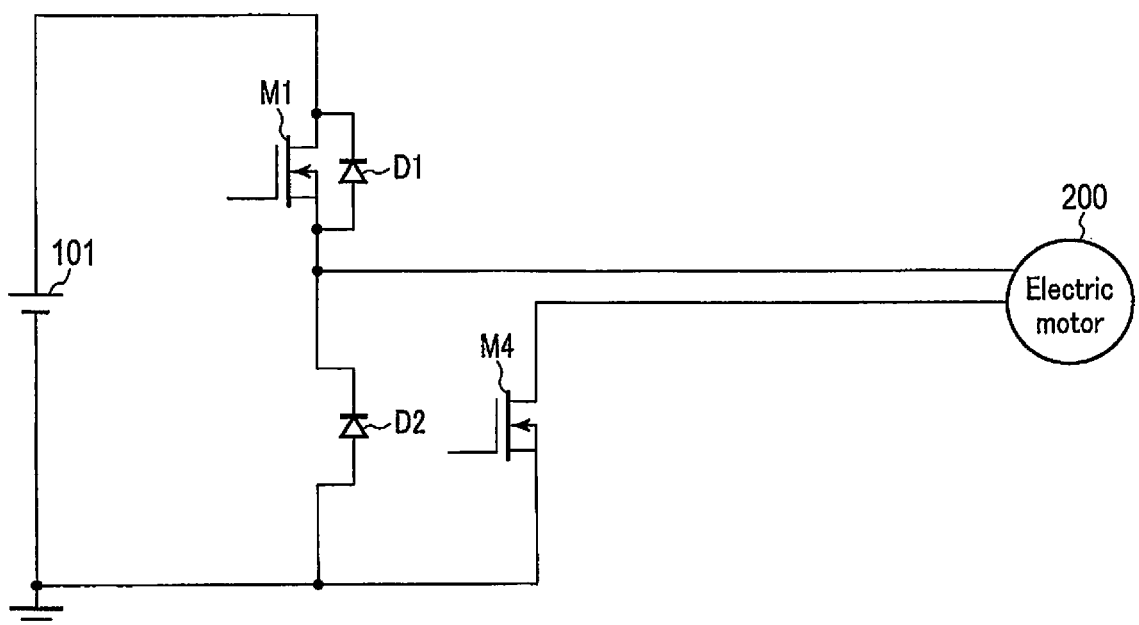
FIG. 3 is a diagram illustrating the control over each arm of the inverter circuit under one of drive patterns set by the inspection apparatus according to the first embodiment during the inspection mode.

FIG. 3 illustrates the control over the arms 1 to 6 in the case where the arm 2 is set as a target for inspection of abnormal heating. According to the example shown in FIG. 3, ON/OFF of the arm 1 is controlled based on a control output, the arms 2, 3, 5, and 6 are fixed in an OFF-state, and the arm 4 is fixed in an ON-state. When the arm 1 is ON, a current flows through a path including the power supply 101, the MOSFET M1, the electric motor 200, and the MOSFET M4. On the other hand, when the arm 1 is OFF, a current flows through a path including the diode D2, the electric motor 200, and the MOSFET M4. When the temperature of the diode D2 is increased by driving the inverter circuit 100, a forward-direction voltage of the diode D2 is decreased. In this respect, the temperature of the diode D2 may be increased by driving the inverter circuit 100 according to the drive pattern in FIG. 3. However, the temperature of the diode D2 may be increased once by driving the inverter circuit 100 under the normal mode, and thereafter the drive pattern in FIG. 3 may be set. This indicates that the voltage drop of the diode D2 becomes small, thereby rising the gain of a control target when viewed from a control system of the inverter circuit 100, i.e., the inspection apparatus 300 in this example. Therefore, regardless of the fact that the inverter circuit 100 has a constant load condition, a control output is not converged to a fixed value but is decreased as the temperature of the diode D2 is increased.

Figure 5:
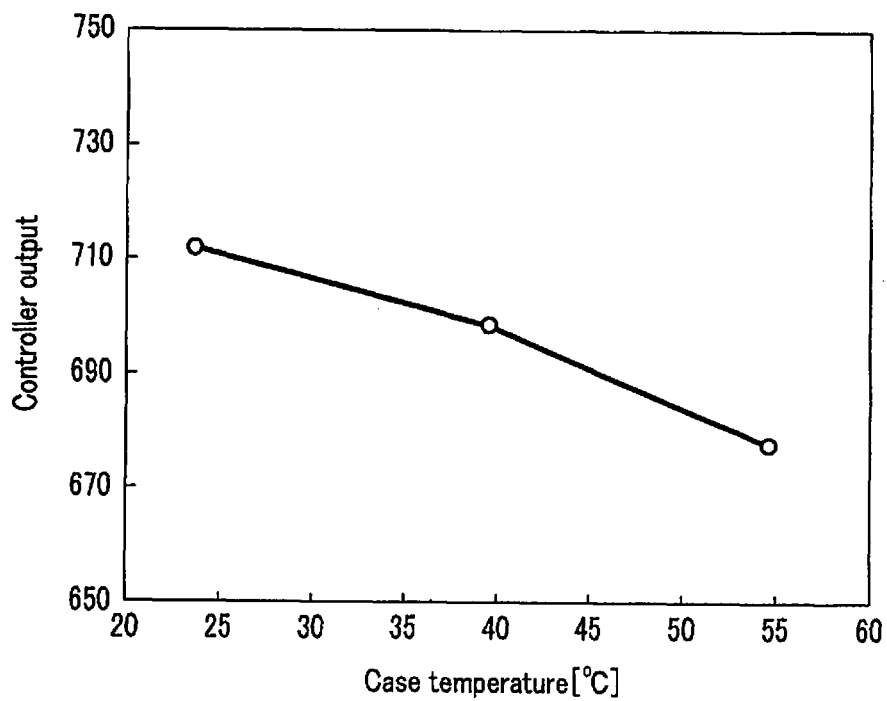
FIG. 5 is a graph illustrating a relation between a temperature of an arm 2 and a control output, obtained from the experiment in which the arm 2 is heated under the drive pattern in FIG. 3.

This is confirmed by the experimental results, too. FIG. 5 illustrates the variation in control output in response to a (package) temperature of the arm 2, obtained from the experiment conducted by driving the arms 1 to 6 according to the drive pattern in FIG. 3 while externally heating only the arm 2 using a hot plate. In FIG. 5, the vertical axis represents a control output, while the horizontal axis represents a temperature of the arm 2. It is clear from FIG. 5 that, according to the drive pattern in FIG. 3, a control output is decreased as a temperature of the arm 2 is increased.

As described above, if the memory 330 stores a history of control output obtained when the inverter circuit 100 is driven according to the drive pattern in FIG. 3, it is possible to estimate a temperature of the diode D2, for example, what temperature the diode D2 reaches, how much a temperature is incremented, how fast a temperature is increased, etc. A relation between a temperature of an arm as a target for inspection and a control output is easier to detect as a voltage of the power supply 101 is lower.

In the case where the arm 2 is set as a target for inspection, the arm 6, not the arm 4, may be fixed in an ON-state. In the case where a target for inspection is set to an arm other than the arm 2, a drive pattern may also be set in a similar manner. FIG. 4 shows the examples of settable drive patterns. The drive pattern in FIG. 3 corresponds to a drive pattern 1 in FIG. 4.

In FIG. 4, "Control" means controlling ON/OFF of an arm according to a control output, "ON" means fixing an arm in an ON-state, and "OFF" means fixing an arm in an OFF-state. "Current direction" means that a current flows from a phase as a start point via the electric motor 200 to a phase as an end point. "Arm with diode making large contribution" means an arm as a target for inspection. None of the drive patterns in FIG. 4 is affected by the rotation of the electric motor 200 because the electric motor 200 is not rotated according to any of these patterns.

The inspector 350 reads from the memory 330 a history of control output obtained when any drive pattern was set, and based on this history, inspects abnormal heating of an arm set as a target for inspection according to this particular drive pattern. For example, the inspector 350 inspects abnormal heating of the arm 2 based on a history of control output obtained when the drive pattern 1 in FIG. 4 was set.

Specifically, the inspector 350 may inspect the presence/absence of abnormal heating in an arm as a target for inspection, based on a comparison between a reference value and a value based on control outputs which were obtained while a drive pattern was set. Examples of the aforementioned value based on control outputs include a control output obtained at one time point or a processed value of this control output, or a statistic value of control outputs at multiple time points (for example, an average value, a median value, a mode value, a minimum value, a maximum value, a variation width, etc.) or a processed valued of this statistic value. A reference value is derivable by using, for example, a value obtained before the initial operation of the inverter circuit 100, a value obtained before the normal operation of the inverter circuit 100, a value obtained before warming up of the inverter circuit 100, etc.

When the same target for inspection is set between two drive patterns (for example, the drive pattern 1 and the drive pattern 2 in FIG. 4), the inspector 350 may compare a history of control output obtained when one drive pattern was set, with a history of control output obtained when the other drive pattern was set, and based on this comparison, estimate whether a decreased control output is caused by abnormal heating of the arm as a target for inspection. That is, if one of these two drive patterns shows a decrease in control output while the other drive pattern shows no such a phenomenon, the cause for this phenomenon can be estimated to be other than the arm as a target for inspection.

The control system in FIG. 1 operates as in FIG. 13. First, mode selection is made (step S601). In this example, either the inspection mode or the normal mode is selectable. However, an additional mode may be defined.

Depending on which mode is selected in step S601, the subsequent processing is split (step S602). Specifically, if the inspection mode is selected, the switch 500 connects the inspection apparatus 300 and the inverter circuit 100, and the processing proceeds to step S603. Although not shown in FIG. 13, the inspection apparatus 300 sets one of drive patterns during the transition from step S602 to step S603.

On the other hand, in step S602, if the normal mode is selected, the switch 500 connects the normal operation control system 400 and the inverter circuit 100, and the processing proceeds to step S608. If the operation in FIG. 14, to be described later, is performed in the normal mode, the switch 500 first connects the inspection apparatus 300 and the inverter circuit 100, and then connects the normal operation control system 400 and the inverter circuit 100.

In step S603, the inspection apparatus 300 drives the inverter circuit 100 according to the set drive pattern. Herein, the memory 330 records a history of control output or line current during execution of step S603 (step S604). Herein, in the inspection mode, the inspection may be performed for all or only part of arms. With respect to the arms each set as a target for inspection, if record of control outputs or line currents, which were obtained when a corresponding drive pattern was set, is completed for all the arms, the processing proceeds to step S607 (step S605). Otherwise, the processing proceeds to step S606 (step S605). In step S606, the inspection apparatus 300 selects and sets one of unset drive patterns corresponding to an arm set as a target for inspection. After step S606, the processing returns to step S603.

In step S607, with respect to the arms each set as a target for inspection, the inspector 350 inspects abnormal heating of each of the arms based on a history of control output or line current recorded in step S604.

Figure 14:
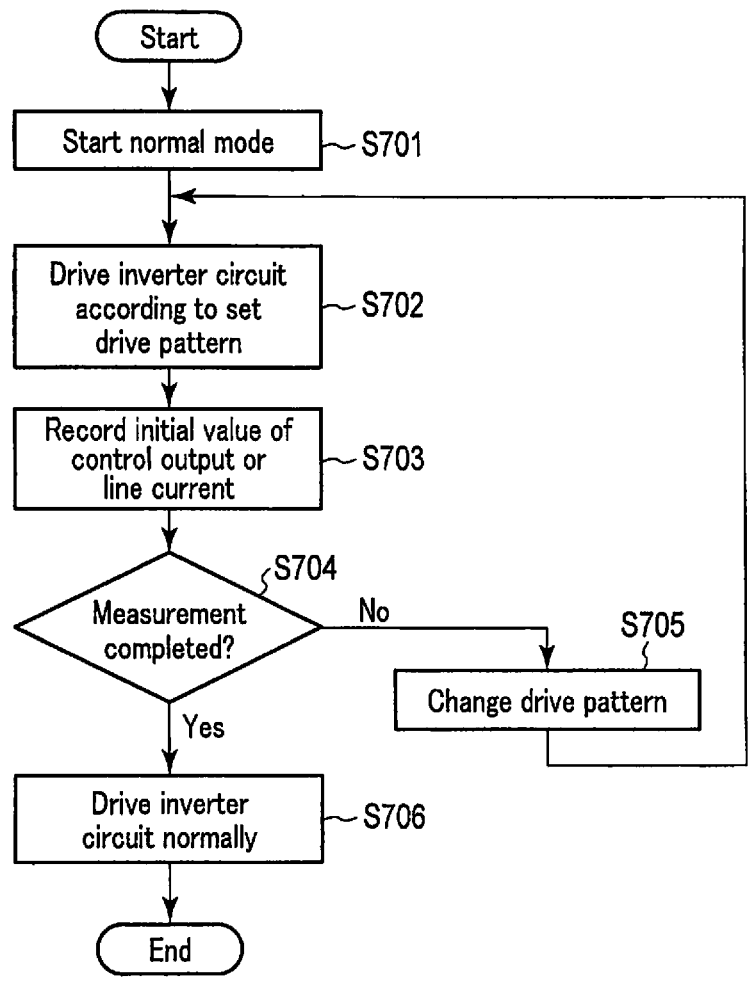
FIG. 14 is a flowchart illustrating operation of the control system in FIG. 1, during a normal mode.

On the other hand, in step S608, the normal operation control system 400 drives the inverter circuit 100 normally so that, for example, the inverter circuit 100 rotatably drives the electric motor 200. In the normal mode, it is also possible to set a reference value which is usable in the inspection mode, before the normal operation control system 400 drives the inverter circuit 100 normally. FIG. 14 illustrates an example of this operation.

According to the example of operation in FIG. 14, when the normal mode is initiated (step S701), the switch 500 first connects the inspection apparatus 300 and the inverter circuit 100, and the processing proceeds to step S702. Although not shown in FIG. 14, the inspection apparatus 300 sets one of drive patterns during the transition from step S701 to step S702.

In step S702, the inspection apparatus 300 drives the inverter circuit 100 according to the set drive pattern. The memory 330 records a history of control output or line current (for example, an initial value with the least impact of arm's heating) obtained during execution of step S702 (step S703). Herein, in the inspection mode, a reference value may be set for all or only part of arms. With respect to the arms each set as a target for setting a reference value, if record of control outputs or line currents, which were obtained when a corresponding drive pattern was set, is completed for all the arms, the processing proceeds to step S706 (step S704). Otherwise, the processing proceeds to step S705 (step S704). In step S705, the inspection apparatus 300 selects and sets one of unset drive patterns corresponding to an arm as a target for setting a reference value. After step S705, the processing returns to step S702.

In step S706, the normal operation control system 400 drives the inverter circuit 100 normally. The operation in FIG. 14 may be, but not necessarily, performed every time the normal mode is selected. The operation in FIG. 14 may be performed only once during initial execution of the normal mode (after production or repair). Alternatively, the operation in FIG. 14 may be performed every time the number of times or a period of time that the inverter circuit 100 operates in the normal mode reaches a preset value. Alternatively, the operation in FIG. 14 may be performed at predetermined intervals.

On the other hand, although not shown in FIG. 14, the inspection apparatus 300 sets a reference value for each arm as a target for setting a reference value, based on a history of control output or line current recorded in step S703. As described above, the impact of an individual difference between the arms on the inspection accuracy can be absorbed by individually setting a reference value for each of the arms.

Figure 15:
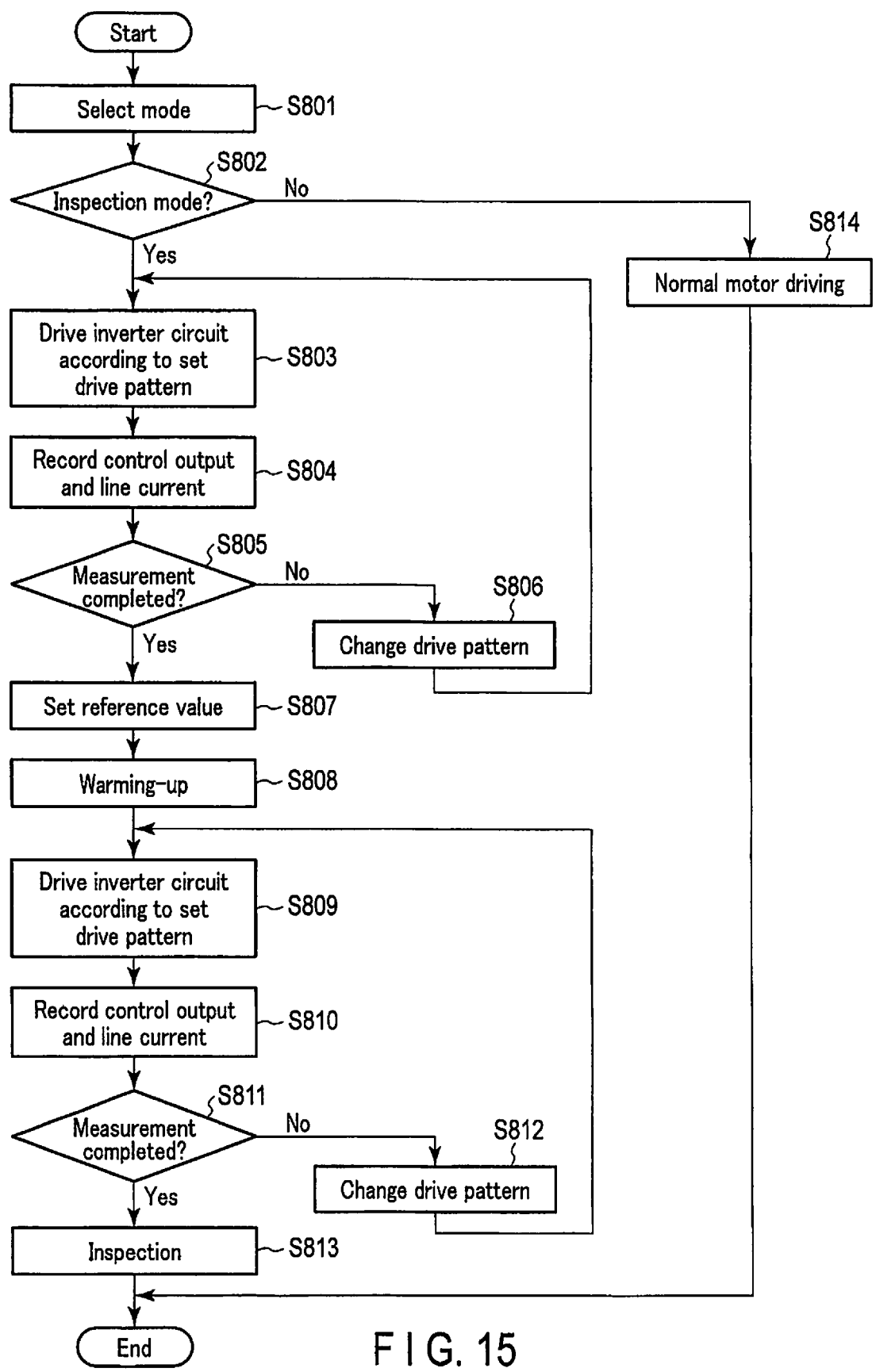
FIG. 15 is a flowchart illustrating a modification of FIG. 13.

The example of operation in FIG. 13 may be modified as shown in FIG. 15. An example of operation in FIG. 15 includes a first phase for setting a reference value, a second phase for warming up the inverter circuit 100, and a third phase for inspecting an arm. First, mode selection is made (step S801). In this example, either the inspection mode or the normal mode is selectable. However, an additional mode may be defined.

Depending on which mode is selected in step S801, the subsequent processing is split (step S802). Specifically, if the inspection mode is selected, the switch 500 connects the inspection apparatus 300 and the inverter circuit 100, and the processing proceeds to step S803. Although not shown in FIG. 15, the inspection apparatus 300 sets one of drive patterns during the transition from step S802 to step S803.

On the other hand, in step S802, if the normal mode is selected, the switch 500 connects the normal operation control system 400 and the inverter circuit 100, and the processing proceeds to step S814.

In step S803, the inspection apparatus 300 drives the inverter circuit 100 according to the set drive pattern. The memory 330 stores a history of control output or line current (for example, an initial value least affected by heating of arm) obtained during execution of step S803 (step S804). Herein, in the inspection mode, the inspection may be performed for all or only part of arms. With respect to all the arms each set as a target for inspection, if record of control outputs or line currents, which were obtained when a corresponding drive pattern was set, is completed, the processing proceeds to step S807 (step S805). Otherwise, the processing proceeds to step S806 (step S805). In step S806, the inspection apparatus 300 selects and sets one of unset drive patterns corresponding to an arm set as a target for inspection. After step S806, the processing returns to step S803.

In step S807, with respect to the arms each set as a target for inspection, the inspection apparatus 300 sets a reference value for each of the arms based on a history of control output or line current recorded in step S804. As described above, the impact of an individual difference between the arms on the inspection accuracy can be absorbed by individually setting a reference value for each of the arms.

Next, the inverter circuit 100 is warmed up (step S808). This warming-up means that at least (a diode of) one of the arms 1 to 6 included in the inverter circuit 100, the one as a target for inspection, is driven for a sufficient time or multiple times on a trial base. This warming-up produces an effect of making it easy to observe a sign of abnormal heating when this particular arm is broken. In step S808, either the inspection apparatus 300 or the normal operation control system 400 may drive the inverter circuit 100. After step S808, the processing proceeds to step S809. Although not shown in FIG. 15, the inspection apparatus 300 sets one of drive patterns during the transition from step S808 to step S809.

In step S809, the inspection apparatus 300 drives the inverter circuit 100 according to the set drive pattern. Herein, the memory 330 records a history of control output or line current during execution of step S809 (step S810). With respect to the arms each set as a target for inspection, if record of control outputs or line currents, which were obtained when a corresponding drive pattern was set (after execution of step S808), is completed for all the arms, the processing proceeds to step S813 (step S811). Otherwise, the processing proceeds to step S812 (step S811). In step S812, the inspection apparatus 300 selects and sets one of drive patterns which are unset (after execution of step S808) and correspond to an arm set as a target for inspection. After step S812, the processing returns to step S809.

In step S813, with respect to the arms each set as a target for inspection, the inspector 350 inspects abnormal heating of each of the arms based on a reference value set in step S807 and a history of control output or line current recorded in step S810.

As described above, the inspection apparatus according to the first embodiment controls the three pairs of arms included in the three-phase inverter circuit in a manner so that one pair is fixed in an OFF-state and the other two pairs are operated like a step-down chopper circuit. Specifically, the inspection apparatus performs ON/OFF control in a manner so that one arm in a pair, as a target for inspection, is fixed in an OFF-state, and a line current of the other arm approaches a current command value. With a focus on the fact that a control output is decreased as a temperature of an arm as a target for inspection is increased, the inspection apparatus inspects abnormal heating of this arm based on a control output. Therefore, this inspection apparatus enables abnormal heating to be detected based on electrical characteristics of an arm, that is, a power device, without the necessity of an additional sensor such as a temperature sensor.

Second Embodiment

In the first embodiment described above, the inspection apparatus 300 inspects abnormal heating of an arm by utilizing a drive pattern under which one pair of three pairs of arms in the inverter circuit 100 is fixed in an OFF-state, and the other two pairs are operated like a step-down chopper circuit. In contrast, in the second embodiment described below, the inspection apparatus 300 inspects abnormal heating of an arm by utilizing a drive pattern different from that of the first embodiment. Specifically, in the present embodiment, the control signal generator 340 and the inspector 350 are different in operation from those of the first embodiment.

As in the first embodiment, the control signal generator 340 sets any of predetermined drive patterns, generates control signals for the arms 1 to 6 in accordance with this set drive pattern, and sends the control signals to the gate driver 102 via the switch 500. However, in the present embodiment, the control signal generator 340 controls ON/OFF of the arms 1 to 6 in a manner so that two arms, each of which is a target for inspection of abnormal heating, increase a contribution of their diodes to a control output. In addition, the current command value generator (not shown) changes at least one of a magnitude or a sign of a current command value in accordance with switching of a set drive pattern.

For example, based on a control output generated by the current controller 320, the control signal generator 340 generates a control signal for ON/OFF control of arms (also referred to as the first arm and the third arm, for convenience) paired with two arms (also referred to as the second arm and the fourth arm, for convenience) each set as a target for inspection of abnormal heating. That is, the same control signal is supplied to the first arm and the third arm. Furthermore, the control signal generator 340 generates control signals in a manner to secure a current path including diodes of the second arm and the fourth arm when the first arm and the third arm are OFF. Specifically, the control signal generator 340 generates a control signal for fixing an arm (also referred to as the fifth arm, for convenience) connected to a common power supply terminal shared with the second arm and the fourth arm in an ON-state, and a control signal for fixing the remaining one arm (also referred to as the sixth arm) in an OFF-state When the control signal generator 340 generates control signals in this manner, the inverter circuit 100 operates like a step-down chopper circuit (partially parallelized). However, generally in the step-down chopper circuit, ON/OFF control of arms is performed as follows. In a pair of arms, when one arm (herein, corresponding to the first and third arms) which repeats ON/OFF is in an OFF-state, the other arm (herein, corresponding to the second and fourth arms) is turned ON so as to shorten the time during which a current flows into a diode of the other arm (the second and fourth arms). However, the inspection apparatus 300 fixes these second and fourth arms in an OFF-state so as to increase a contribution of the diodes of the second and fourth arms to a control output by prolonging the time during which a current flows into these diodes of the second and fourth arms.

Figure 6:
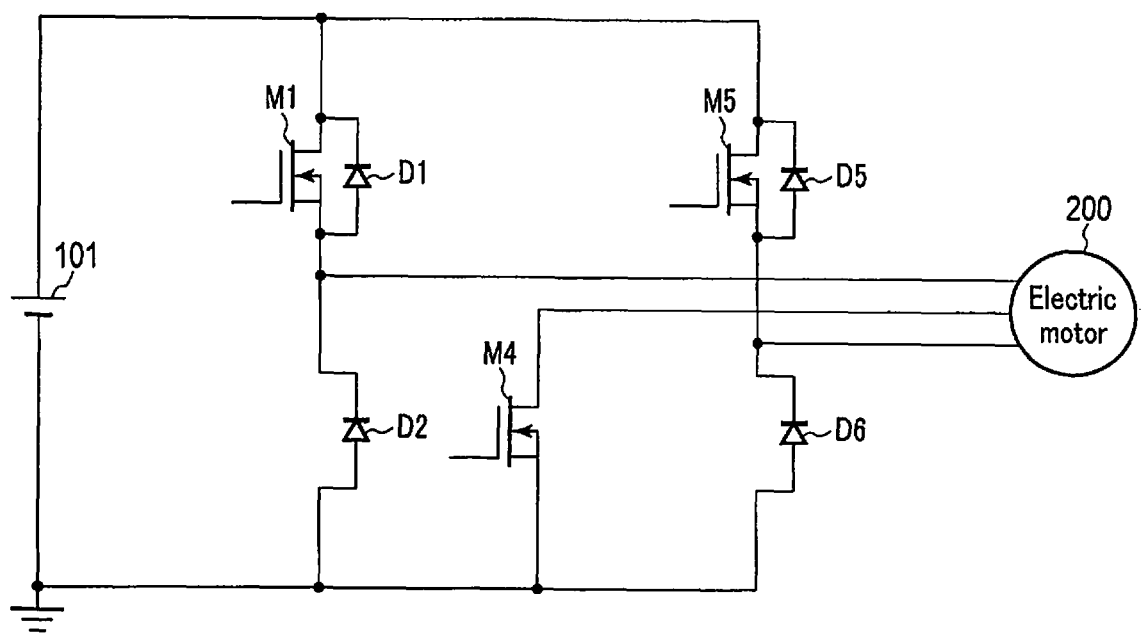
FIG. 6 is a diagram illustrating the control over each arm of an inverter circuit under one of drive patterns set by an inspection apparatus according to the second embodiment during the inspection mode.
Figure 7:
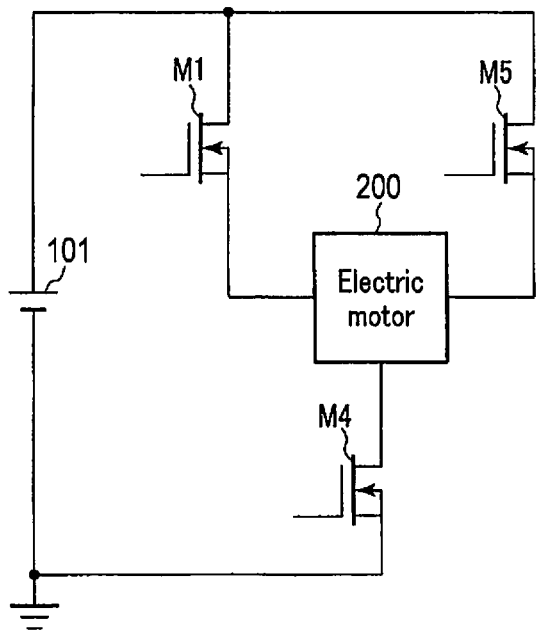

FIG. 6 illustrates the control over the arms 1 to 6 in the case where the arm 2 and the arm 6 are set as targets for inspection of abnormal heating. According to the example shown in FIG. 6, ON/OFF of the arms 1 and 5 is controlled based on a control output, the arms 2, 3, and 6 are fixed in an OFF-state, and the arm 4 is fixed in an ON-state. When the arms 1 and 5 are ON, as illustrated in FIG. 7, a current flows through a path including the power supply 101, the MOSFET M1 or MOSFET M5, the electric motor 200, and the MOSFET M4. On the other hand, when the arms 1 and 5 are OFF, as illustrated in FIG. 8, a current flows through a path including the diode D2 or D6, the electric motor 200, and the MOSFET M4.

Figure 8:
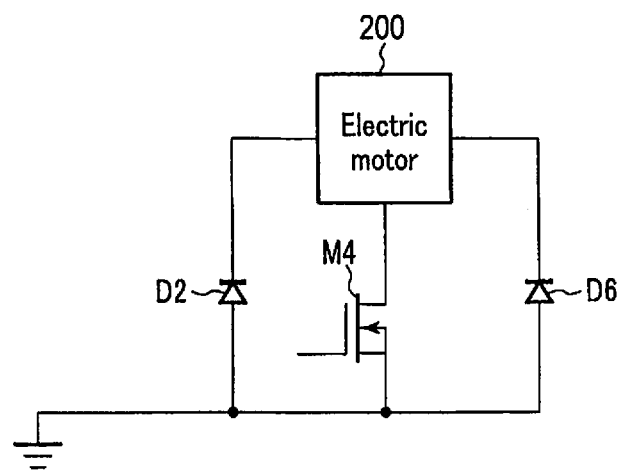
FIG. 8 is a diagram illustrating the equivalent circuit of the inverter circuit and the electric motor when the arm 1 and the arm 5 in FIG. 6 are OFF.

As illustrated in FIG. 8, when the arms 1 and 5 are OFF, the diode D2 and inductor Lu (not shown) within the electric motor 200 are coupled in parallel to the diode D6 and inductor Lw (not shown) within the electric motor 200. Assuming that the inductor Lu and the inductor Lw have substantially the same characteristics, the diode D2 and the diode D6 are equal in voltage drop.

When the inverter circuit 100 is driven, both of the diode D2 and the diode D6 are increased in temperature; however, their temperature variations do not always match. In this respect, the temperatures of the diodes D2 and D6 may be increased by driving the inverter circuit 100 according to the drive pattern in FIG. 6. However, the drive pattern in FIG. 6 may be set after the temperatures of the diodes D2 and D6 are increased by driving the inverter circuit 100 once under the normal mode. If one of the arms 2 and 6 is broken, their temperature variations are assumed to be different. Specifically, a broken arm (herein, assumed to be the arm 2) is prone to increase its temperature as compared to an arm in good order (herein, assumed to be the arm 6). Therefore, while the arm 1 and the arm 5 repeat ON/OFF, more current flows into the diode D2 as compared to the diode D6.

Figure 10:
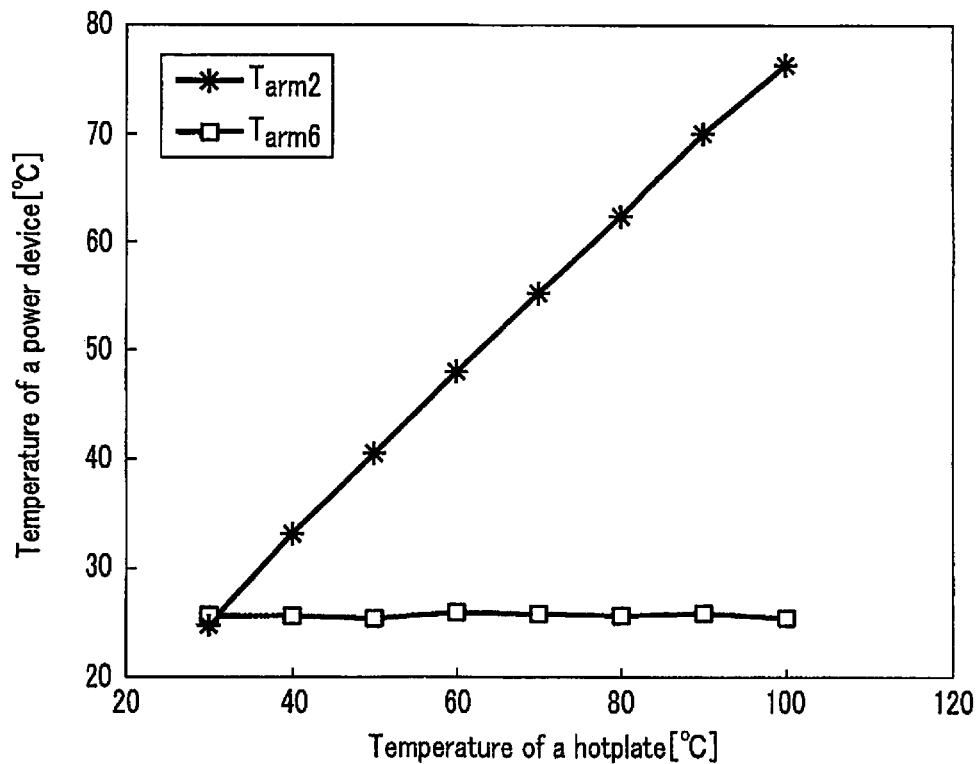
FIG. 10 is a graph illustrating a relation between a temperature of a heat source and temperatures of the arm 2 and an arm 6, obtained from the experiment in which the arm 2 is heated under the drive pattern in FIG. 6.

This is confirmed by the experimental results, too. FIG. 10 illustrates the variations in (package) temperature of the arm 2 and the arm 6, obtained from the experiment conducted by driving the arms 1 to 6 according to the drive pattern in FIG. 6 while externally heating only the arm 2 using a hot plate. In the experiment, a voltage of the power supply 101 is set to 15 [V], a current command value is set to 0.3 [A], and a preset temperature of a hot plate is changed by 10 [*C]. In FIG. 10, the vertical axis represents a temperature of the arm 2 or 6, while the horizontal axis represents a preset temperature of a hot plate. It is understood from FIG. 10 that there is little interdependence between a temperature of the arm 2 and a temperature of the arm 6.

Figure 11:
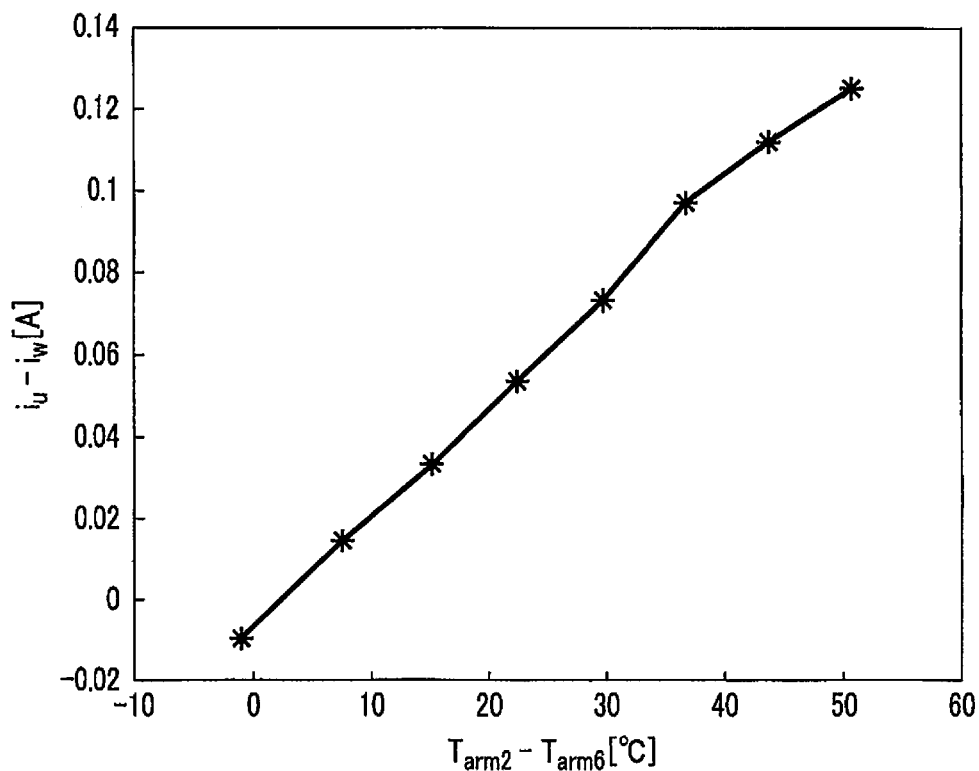
FIG. 11 is a graph illustrating a relation between a temperature difference between the arm 2 and the arm 6, and a difference between line currents flowing through the arms 2 and 6, according to the example shown in FIG. 10.

FIG. 11 illustrates the variation in difference between line currents (iu and iw) flowing through the arms 2 and 6 in response to a temperature difference between the arms 2 and 6, obtained from the experiment. In FIG. 11, the vertical axis represents a difference between line currents flowing through the arms 2 and 6, while the horizontal axis represents a temperature difference between the arms 2 and 6. It is understood from FIG. 11 that a difference between line currents of the arms 2 and 6 increases as one of them is increased in temperature due to abnormal heating according to the drive pattern in FIG. 6.

As described above, if the memory 330 stores a history of line current obtained when the inverter circuit 100 is driven according to the drive pattern in FIG. 6, it is possible to estimate a temperature difference between the diodes D2 and D6, for example, what temperature difference the diodes D2 and D6 show, how much a temperature difference is incremented, how fast a temperature difference is increased, etc.

Figure 12:
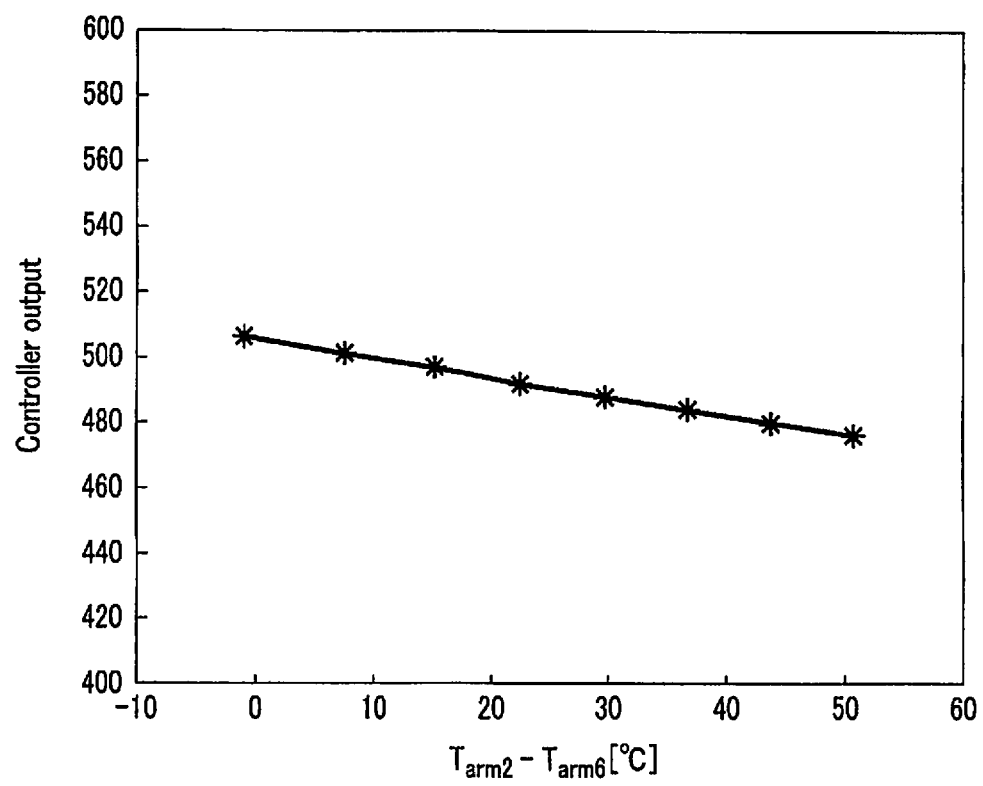
FIG. 12 is a graph illustrating a relation between a temperature difference between the arms 2 and 6, and control outputs, according to the example in FIG. 10.

In the present embodiment, the inspector 350 may perform both of this inspection based on a history of line current, described above, and inspection based on a history of control output, described in the first embodiment. FIG. 12 shows the variation in control output in response to a temperature difference between the arm 2 and the arm 6, obtained from the same experiment. In FIG. 12, the vertical axis represents a control output, while the horizontal axis represents a temperature difference between the arms 2 and 6. Considering that FIG. 10 shows little variation in temperature of the arm 6, it is clear from FIG. 12 that a control output is decreased as a temperature of the arm 2 is increased according to the drive pattern in FIG. 6.

As described above, if the memory 330 stores a history of control output obtained when the inverter circuit 100 is driven according to the drive pattern in FIG. 6, in the course of which one of the diodes D2 and D6 is abnormally heating and the other diode has an ignorable temperature variation, it is possible to estimate a temperature of one diode with abnormal heating, for example, what temperature this diode reaches, how much a temperature is incremented, how fast a temperature is increased, etc.

In the case where a target for inspection is set to an arm other than the arms 2 and 6, a drive pattern may also be set in a similar manner. FIG. 9 shows the examples of settable drive patterns. The drive pattern in FIG. 6 corresponds to a drive pattern 1 in FIG. 9.

In FIG. 9, "Control" means controlling ON/OFF of an arm according to a control output, "ON" means fixing an arm in an ON-state, and "OFF" means fixing an arm in an OFF-state. "Current direction" means that a current flows from one or two phases as a start point via the electric motor 200 to two or one phase as an end point. "Arms with diodes making large contribution" means two arms as targets for inspection. None of the drive patterns in FIG. 9 is affected by rotation of the electric motor 200 because the electric motor 200 is not rotated according to any of these patterns.

The inspector 350 reads from the memory 330, a history of line current and (optionally) a history of control output obtained when any drive pattern was set, and based on these histories, inspects abnormal heating of two arms set as targets for inspection under the set drive pattern. For example, the inspector 350 inspects abnormal heating of the arms 2 and 6 based on a history of line current (and control output) obtained when the drive pattern 1 in FIG. 9 was set.

Specifically, the inspector 350 may inspect the presence/absence of abnormal heating in one of two arms as targets for inspection, based on a comparison between a reference value and a value based on a difference between line currents flowing through the two arms which were obtained while a drive pattern was set. Examples of the aforementioned value based on a difference between line currents include a difference between line currents obtained at one time point or a processed value of this difference, or a statistic value of differences between line currents at multiple time points (for example, an average value, a median value, a mode value, a minimum value, a maximum value, a variation width, etc.) or a processed valued of this statistic value. A reference value can be derived by using, for example, a value obtained before the initial operation of the inverter circuit 100, a value obtained before the normal operation of the inverter circuit 100, a value obtained before warming up of the inverter circuit 100, etc. A reference value with respect to a difference between line currents may be set in a similar manner to a reference value with respect to a control output, as described using FIGS. 14 and 15. A difference between line currents may be replaced with other indexes indicative of a relation between two line currents to notice, for example, a ratio between line currents, etc.

As in the case of the first embodiment described above, the inspector 350 may inspect the presence/absence of abnormal heating in one of two arms as targets for inspection, based on a comparison between a reference value and a value based on control outputs which are obtained while a drive pattern is set.

When a target for inspection is overlapping between two drive patterns (for example, the second arm as a target for inspection is overlapping between the drive patterns 1 and 2 in FIG. 9), the inspector 350 may compare a history of difference between line currents obtained when one drive pattern was set, with a history of difference between line currents obtained when the other drive pattern was set, and based on this comparison, estimate whether a decreased or increased difference between line currents is caused by abnormal heating of the arm as a target for inspection. That is, if one of these two drive patterns shows a decrease or increase in a difference between line currents while the other drive pattern shows no such phenomenon, the cause for this phenomenon can be estimated to be other than the arm as a target for inspection. The inspector 350 may make a similar comparison for a history of control output.

As described above, the inspection apparatus according to the second embodiment drives three pairs of arms included in the three-phase inverter circuit, in a similar manner to a step-down chopper circuit. Specifically, the inspection apparatus performs ON/OFF control in a manner so that two arms as targets for inspection are fixed in an OFF-state, and line currents of other two arms, which are paired with the two arms as targets for inspection, approach a current command value. Based on the fact that if one of the two arms as targets for inspection is broken a current is concentrated on this broken arm, the inspection apparatus inspects abnormal heating of this arm based on a relation between line currents flowing through these arms. Therefore, this particular inspection apparatus enables abnormal heating to be detected based on electrical characteristics of an arm, that is, a power device, without the necessity of an additional sensor such as a temperature sensor.

Various functional units described in each of the above embodiments may be realized by using a circuit. A circuit may be a dedicated circuit for realizing a particular function or may be a general circuit such as a processor.

At least part of the processing described in each of the above embodiments can be realized by using a processor such as a CPU mounted on a general computer, a microcomputer, a FPGA, a DSP, etc., as basic hardware. As a way of providing a program for realizing the processing described above, such a program may be stored in a computer-readable storage medium. A program can be recorded in a storage medium as a file in an installable form or an executable form. Examples of recording media include a magnetic disc, an optical disk (CD-ROM, CD-R, DVD, etc.), a magneto-optical (MO) disk, a semiconductor memory, etc. A storage medium is usable as long as it can record a program and is computer-readable. A program for realizing the processing described above may be stored on a computer (server) connected to a network such as the Internet, and be downloaded to a computer (client) via the network.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An inspection apparatus that inspects an inverter circuit including three pairs of arms, the apparatus comprising:
    a current controller that generates a control output for controlling a current to be output by the inverter circuit, wherein the control output enables the current to approach a target value of the current;
    a control signal generator that generates a first control signal for controlling ON/OFF of a first arm as one of the three pairs of arms based on the control output, a second control signal for fixing a second arm paired with the first arm, in an OFF-state, and a third control signal for fixing one of two arms connected to a common power supply terminal shared with the second arm in an ON-state; and
    an inspector that inspects the second arm based on at least one of the current and the control output, wherein:
        the first control signal is supplied to a third arm as one of two arms that are connected to a common power supply terminal shared with the first arm;
        the second control signal is supplied to a fourth arm paired with the third arm; and
        the inspector inspects abnormal heating of the second arm and the fourth arm based on a relation between a first current output from a first node between the first arm and the second arm, and a second current output from a second node between the third arm and the fourth arm.

2. The apparatus according to claim 1, wherein the inspector inspects abnormal heating of the second arm based on a comparison between a value based on the control output and a reference value.

3. The apparatus according to claim 2, further comprising a memory that records a history of the control output, wherein:
    the inverter circuit is operable in a mode selected from a plurality of modes Including a normal mode for rotatably driving an electric motor, and an inspection mode for inspecting abnormal heating in part or all of the three pairs of arms;
    the current controller and the control signal generator drive the three pairs of arms according to a given pattern after the normal mode is initiated and before the electric motor is rotatably driven; and
    the reference value is set based on the control output that is recorded in the memory when the three pairs of arms are driven according to the given pattern after the normal mode is initiated and before the electric motor is rotatably driven.

4. The apparatus according to claim 1, further comprising a memory that records a history of the control output, wherein:
    the inverter circuit is operable in a mode selected from a plurality of modes including an inspection mode for inspecting abnormal heating in part or all of the three pairs of arms;
    the inspection mode includes a first phase, a second phase subsequent to the first phase, and a third phase subsequent to the second phase;
    the current controller and the control signal generator drive the three pairs of arms according to a given pattern in the first phase;
    the reference value is set based on the control output recorded in the memory, in the first phase;
    the three pairs of arms are warmed up in the second phase; and
    the inspection apparatus inspects abnormal heating of the second arm in the third phase.

5. The apparatus according to claim 1, wherein:
    the third control signal is supplied to a fifth arm that is connected to a common power supply terminal shared with the second arm and the fourth arm; and
    the second control signal is supplied to a sixth arm paired with the fifth arm.

6. The apparatus according to claim 1, wherein the inspector inspects abnormal heating of the second arm and the fourth arm based on a comparison of a value based on at least one of a difference between the first current and the second current or a ratio between the first current and the second current, and a reference value.

7. The apparatus according to claim 6, further comprising a memory that records a history of the current, wherein:
the inverter circuit is operable in a mode selected from a plurality of modes including a normal mode for rotatably driving an electric motor, and an inspection mode for inspecting abnormal heating in part or all of the three pairs of arms;
the current controller and the control signal generator drive the three pairs of arms according to a given pattern after the normal mode is initiated and before the electric motor is rotatably driven; and
the reference value is set based on the current that is recorded in the memory when the three pairs of arms are driven according to the given pattern after the normal mode is initiated and before the electric motor is rotatably driven.

8. The apparatus according to claim 6, further comprising a memory that records a history of the current, wherein:
the inverter circuit is operable in a mode selected from a plurality of modes Including an inspection mode for inspecting abnormal heating in part or all of the three pairs of arms;
the inspection mode includes a first phase, a second phase subsequent to the first phase, and a third phase subsequent to the second phase;
the current controller and the control signal generator drive the three pairs of arms according to a given pattern in the first phase;
the reference value is set based on the current recorded in the memory, in the first phase;
the three pairs of arms are warmed up in the second phase; and
the inspection apparatus inspects abnormal heating in the second arm and the fourth arm in the third phase.

9. The apparatus according to claim 1, further comprising a command value generator that changes at least one of a magnitude or a sign of a current command value indicative of the target value, in accordance with switching of a drive pattern for setting an arm as a target for inspection by the inspector.

10. An inverter apparatus comprising:
the apparatus according to claim 1; and
the inverter circuit.

11. An inspection method that inspects an inverter circuit including three pairs of arms, the inspection method comprising:

generating a control output for controlling a current to be output by the inverter circuit, wherein the control output enables the current to approach a target value of the current;
generating a first control signal for controlling ON/OFF of a first arm as one of the three pairs of arms based on the control output, a second control signal for fixing a second arm paired with the first arm, in an OFF-state, and a third control signal for fixing one of two arms connected to a common power supply terminal shared with the second arm in an ON-state; and
inspecting the second arm based on at least one of the current and the control output, wherein:
the first control signal is supplied to a third arm as one of two arms that are connected to a common power supply terminal shared with the first arm;
the second control signal is supplied to a fourth arm paired with the third arm; and
the inspector inspects abnormal heating of the second arm and the fourth arm based on a relation between a first current output from a first node between the first arm and the second arm, and a second current output from a second node between the third arm and the fourth arm.

12. A non-transitory computer readable storage medium storing instructions of a computer program which when executed by a computer results in performance of steps comprising:
generating a control output for controlling a current to be output by the inverter circuit, wherein the control output enables the current to approach a target value of the current;
generating a first control signal for controlling ON/OFF of a first arm as one of the three pairs of arms based on the control output, a second control signal for fixing a second arm paired with the first arm, in an OFF-state, and a third control signal for fixing one of two arms connected to a common power supply terminal shared with the second arm in an ON-state; and
inspecting the second arm based on at least one of the current and the control output, wherein:
the first control signal is supplied to a third arm as one of two arms that are connected to a common power supply terminal shared with the first arm;
the second control signal is supplied to a fourth arm paired with the third arm; and
the inspector inspects abnormal heating of the second arm and the fourth arm based on a relation between a first current output from a first node between the first arm and the second arm, and a second current output from a second node between the third arm and the fourth arm.

* * * * *

UNITED STATES PATENT AND TRADEMARK OFFICE
CERTIFICATE OF CORRECTION

PATENT NO. : 10,958,157 B2
APPLICATION NO. : 16/112580
DATED : March 23, 2021
INVENTOR(S) : Shigen Yasunaka et al.

It is certified that error appears in the above-identified patent and that said Letters Patent is hereby corrected as shown below:

Claim 3, Column 16, Line 30, "Including" should read --including--.

Claim 8, Column 17, Line 27, "Including" should read --including--.

Signed and Sealed this
Thirteenth Day of July, 2021

Drew Hirshfeld
*Performing the Functions and Duties of the
Under Secretary of Commerce for Intellectual Property and
Director of the United States Patent and Trademark Office*